United States Patent
Oxland

(10) Patent No.: US 9,590,084 B2
(45) Date of Patent: Mar. 7, 2017

(54) GRADED HETEROJUNCTION NANOWIRE DEVICE

(71) Applicant: Taiwan Semiconductor Manufacturing Company, Ltd., Hsin-Chu (TW)

(72) Inventor: Richard Kenneth Oxland, Brussels (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/554,584

(22) Filed: Nov. 26, 2014

(65) Prior Publication Data

US 2016/0149001 A1     May 26, 2016

(51) Int. Cl.
| | |
|---|---|
| H01L 21/00 | (2006.01) |
| H01L 29/775 | (2006.01) |
| H01L 29/161 | (2006.01) |
| H01L 29/201 | (2006.01) |
| H01L 29/06 | (2006.01) |
| H01L 29/45 | (2006.01) |

(52) U.S. Cl.
CPC ......... *H01L 29/775* (2013.01); *H01L 29/161* (2013.01); *H01L 29/201* (2013.01); *H01L 29/0676* (2013.01); *H01L 29/456* (2013.01)

(58) Field of Classification Search
CPC ......... H01L 29/78681; H01L 29/78696; H01L 29/7787
See application file for complete search history.

(56) References Cited

U.S. PATENT DOCUMENTS

| | | | | |
|---|---|---|---|---|
| 2,569,347 | A | | 9/1951 | Shockley |
| 4,905,063 | A | * | 2/1990 | Beltram .............. G11C 16/0433 257/191 |
| 4,945,393 | A | * | 7/1990 | Beltram ................ H01L 29/803 257/316 |
| 5,687,355 | A | * | 11/1997 | Joardar ............... G06F 17/5036 703/2 |
| 5,986,291 | A | * | 11/1999 | Currie ................. H01L 29/7786 257/192 |
| 6,326,650 | B1 | * | 12/2001 | Allam .................... H01L 29/155 257/18 |
| 2015/0091058 | A1 | * | 4/2015 | Doyle ................. H01L 29/7827 257/192 |

OTHER PUBLICATIONS

Hameed et al, "A Proposed Graded Band Gap Channel (GBGC) MOSFET", Seventeenth National Radio Science Conference, Feb. 22-24, 2000, D3 pp. 1-11.*
Kuhn, Kelin J., "Considerations for Ultimate CMOS Scaling," IEEE Transactions on Electron Devices, vol. 59, No. 7, Jul. 2012, pp. 1813-1828.

* cited by examiner

*Primary Examiner* — Laura Menz
(74) *Attorney, Agent, or Firm* — Slater Matsil, LLP

(57) ABSTRACT

A device includes a source region, a drain region, and a semiconductor channel connecting the source region to the drain region. The semiconductor channel includes a source-side channel portion adjoining the source region, wherein the source-side channel portion has a first bandgap, and a drain-side channel portion adjoining the drain region. The drain-side channel portion has a second bandgap different from the first bandgap.

18 Claims, 10 Drawing Sheets

GRADED HETEROJUNCTION NANOWIRE DEVICE

BACKGROUND

Transistors are key components of modern integrated circuits. To satisfy the requirements of increasingly faster switching speed, the drive currents of transistors need to be increasingly higher. At the same time, the gate lengths of transistors are constantly being scaled down. Scaling down the gate lengths leads to undesirable effects known as "short-channel effects," with which the control of current flow by the gates is compromised. Among the short-channel effects are the drain-induced barrier lowering (DIBL) and the degradation of sub-threshold slope, both of which result in the degradation in the performance of transistors.

The use of multi-gate transistor architecture may help the relief of short-channel effects by improving electrostatic control of the gate on the channel. Fin field-effect transistors (FinFET) were thus developed. To further increase the control of the channels, and to reduce the short-channel effects, transistors having gate-all-around structures were also developed, wherein the respective transistors are also referred to as gate all around transistors. In a gate all around transistor, a gate dielectric and a gate electrode fully encircle the channel region. This configuration delivers a good control of the channel, and the short-channel effects are reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
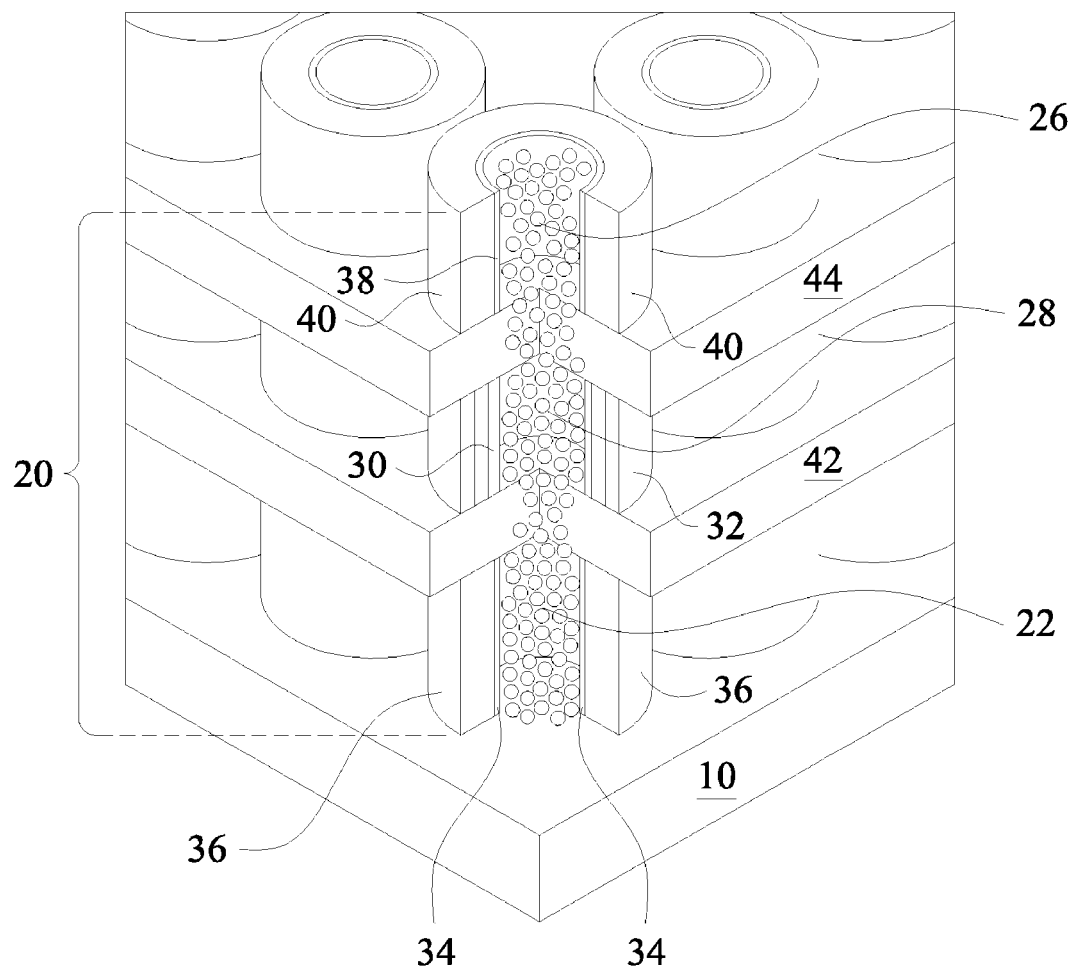
FIG. 1 illustrates a Vertical Gate All Around (VGAA) transistor comprising a nanowire forming a channel region, a source region, and a drain region in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A heterogeneous Vertical Gate All Around (VGAA) transistor is provided in accordance with various exemplary embodiments. The intermediate stages of forming the VGAA transistor are illustrated. The variations of the embodiments are discussed. Throughout the various views and illustrative embodiments, like reference numbers are used to designate like elements.

FIG. 1 illustrates a perspective view of VGAA transistor 20 in accordance with some embodiments of the present disclosure. In FIG. 1, portions of VGAA transistor 20 are not illustrated in order to show the internal structure of VGAA transistor 20. The un-illustrated portions, however, still exist. For example, the illustrated partial rings 22, 26, 28, 30, 32, 34, 36, 38, and 40, etc. are portions of the respective full rings, with some of the full rings not illustrated. VGAA transistor 20 includes drain region 22, source region 26 over drain region 22, and channel region 28 between and interconnecting drain region 22 and source region 26. Each of drain region 22, source region 26, and channel region 28 may be formed as a nanowire having a lengthwise direction perpendicular to the major top and bottom surfaces of the underlying substrate 10, from which drain region 22, source region 26, and channel region 28 are grown. Hence, drain region 22, source region 26, and channel region 28 are also referred to as nanowires throughout the description. The nanowires may have lateral dimensions (length, width, or diameter, depending on their top-view shapes) of server hundred nanometers or smaller. For example, the lateral dimensions of the nanowires may be in the range between about 10 nm and about 500 nm.

In FIG. 1, the illustrated particles (spheres) represent the semiconductor materials of drain region 22, source region 26, and channel region 28. In accordance with some embodiments of the present disclosure, drain region 22 is encircled by region 34, which may be an alloy of the drain material and a metal. Region 34 may be a silicide/germanide when drain region 22 is formed of silicon/germanium, or may be an alloy of a III-V compound semiconductor and a metal when drain region 22 is formed of the III-V compound semiconductor, or may be a III-V compound semiconductor with dopant concentration larger than channel region 28 or drain region 22 and source region 26. Outside of region 34 is drain contact 36, which may be formed of a metal such as tungsten, titanium, aluminum, copper, or alloys thereof. Drain contact 36 may also encircle region 34. In alternative embodiments, region 34 is note formed.

In accordance with some embodiments of the present disclosure, source region 26 is encircled by alloy 38, which is an alloy of the drain region material and a metal. Alloy 38 may be a silicide or germanide when source region 26 is formed of silicon/germanium, or may be an alloy of a III-V compound semiconductor and a metal when source region 26 is formed of the III-V compound semiconductor. Outside of alloy 38 is source contact 40, which may be formed of a metal such as tungsten, titanium, aluminum, copper, or alloys thereof. Source contact 40 may also encircle alloy 38. In some embodiments, source region 26 and drain region 22 may include lightly doped regions (source/drain extensions) and heavily doped source/drain regions. In the present disclosure, the boundaries of the lightly doped source/drain regions and the heavily doped source/drain regions are not illustrated.

Channel region 28 is encircled by gate dielectric 30. In accordance with some embodiments of the present disclosure, gate dielectric 30 comprises silicon oxide, silicon nitride, a high-k dielectric material such as hafnium oxide, zirconium oxide, lanthanum oxide, aluminum oxide, combinations thereof, and/or multi-layers thereof. Gate electrode 32 may be a metal gate including, for example, TiAl, cobalt, aluminum, titanium nitride, tantalum nitride, etc, and may include multiple layers of different materials. Depending on whether the respective VGAA transistor 20 is a P-type Metal-Oxide-Semiconductor (PMOS) transistor or an N-type Metal-Oxide-Semiconductor (NMOS) transistor, the materials of gate electrode 32 is selected to have work functions suitable for the respective MOS transistor.

In accordance with some embodiments of the present disclosure, drain region 22, source region 26, and channel region 28 are formed of group IVA elements, group-IIIA elements, group-VA elements, or combinations thereof. For example, drain region 22, source region 26, and channel region 28 may include group IVA elements such as silicon and germanium. The percentages of silicon and germanium in some or each of drain region 22, source region 26, and channel region 28 are also adjusted to achieve desirable effects such as controlled and/or graded bandgaps, as will be discussed in subsequent paragraphs.

In alternative embodiments, drain region 22, source region 26, and channel region 28 include III-V compound semiconductors such as InAs, InGaAs, GaAs, GaN, GaP, GaAsP, InSb, InGasb, AlInAs, AlGaAs, GaInAs, GaInP, and/or GaInAsP. The percentages of the IIIA and VA elements in some or each of drain region 22, source region 26, and channel region 28 are also adjusted to achieve desirable effects such as controlled and/or graded bandgaps, as will be discussed in subsequent paragraphs.

Drain region 22, source region 26, and channel region 28 may be formed through epitaxy starting from substrate 10, which may be formed of crystalline silicon, sapphire, a III-V compound semiconductor substrate such as a GaN substrate, a GaAs substrate, or the like. During the epitaxy of each of drain region 22, source region 26, and channel region 28, the percentages of the elements such as Si, Ge, In, Ga, As, P, Sb, Al, etc. may be adjusted with the proceeding of the epitaxy. Furthermore, due to the vertical structure, different parts of each of drain region 22, source region 26, and channel region 28 are grown at different times, and hence may have different bandgaps and formed of different materials. The portions of drain region 22, source region 26, and channel region 28 at the same level (same height), however, are formed of the same elements with the same atomic percentages, and have the same bandgap. Accordingly, it is possible to adjust different parts of each of drain region 22, source region 26, and channel region 28 to have the desirable bandgap. In addition, desirable n-type and p-type dopants may be in-situ doped with the proceeding of the epitaxy, so that source/drain regions 22/26 may be doped to desirable p-type (for a pMOS transistor) or n-type (for an n-type transistor). Channel region 28 may be intrinsic (which is not intentionally doped), or may also be doped to n-type (for a pMOS transistor) or p-type (for an n-type transistor). In yet embodiments, the respective transistor may be a junction-less transistor, wherein for an n-type junction-less transistor, channel region 28 is of n-type, and for a junction-less p-type transistor, channel region 28 is of p-type.

Gate spacers 42 and 44 are also formed as horizontal dielectric layers, and may comprise silicon oxide, silicon nitride, silicon oxynitride, silicon carbide or other dielectric materials. Gate dielectric 30 and gate electrode 32 may overlap gate spacer 42 and overlapped by gate spacer 44 in some embodiments.

In accordance with some embodiments of the present disclosure, drain region 22 is underlying channel region 28, which is further underlying source region 26, as illustrated in FIG. 1. In alternative embodiments, the positions of source region 26 and drain region 22 may be inverted (not shown), with source region 26 being underlying channel region 28, which is further underlying drain region 22.

Figure 2:
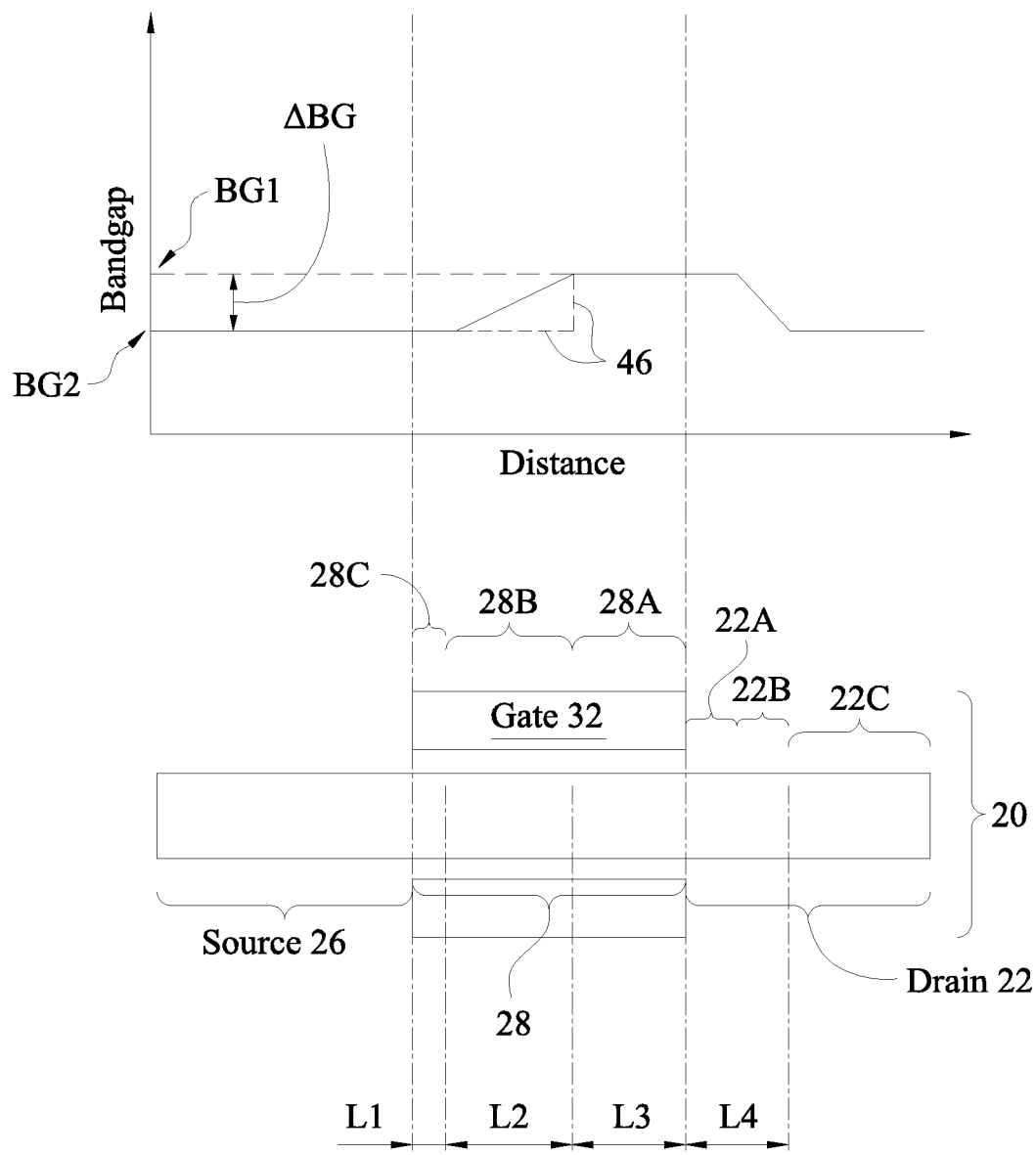
FIGS. 2 through 6 illustrate bandgaps and material composition in the channel region, source region, and drain region of VGAA transistors in accordance with some embodiments.
Figure 4:
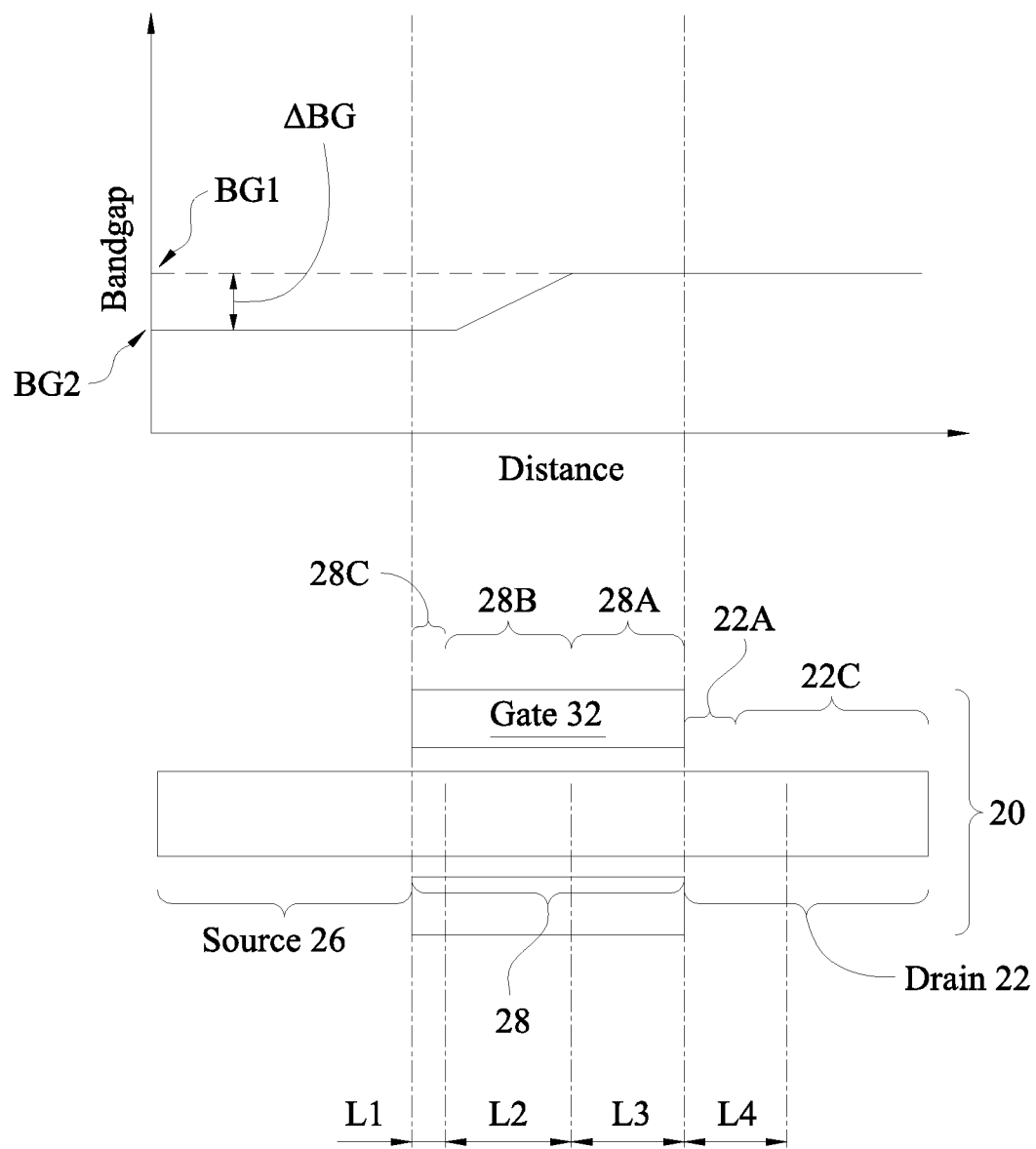
Figure 5:
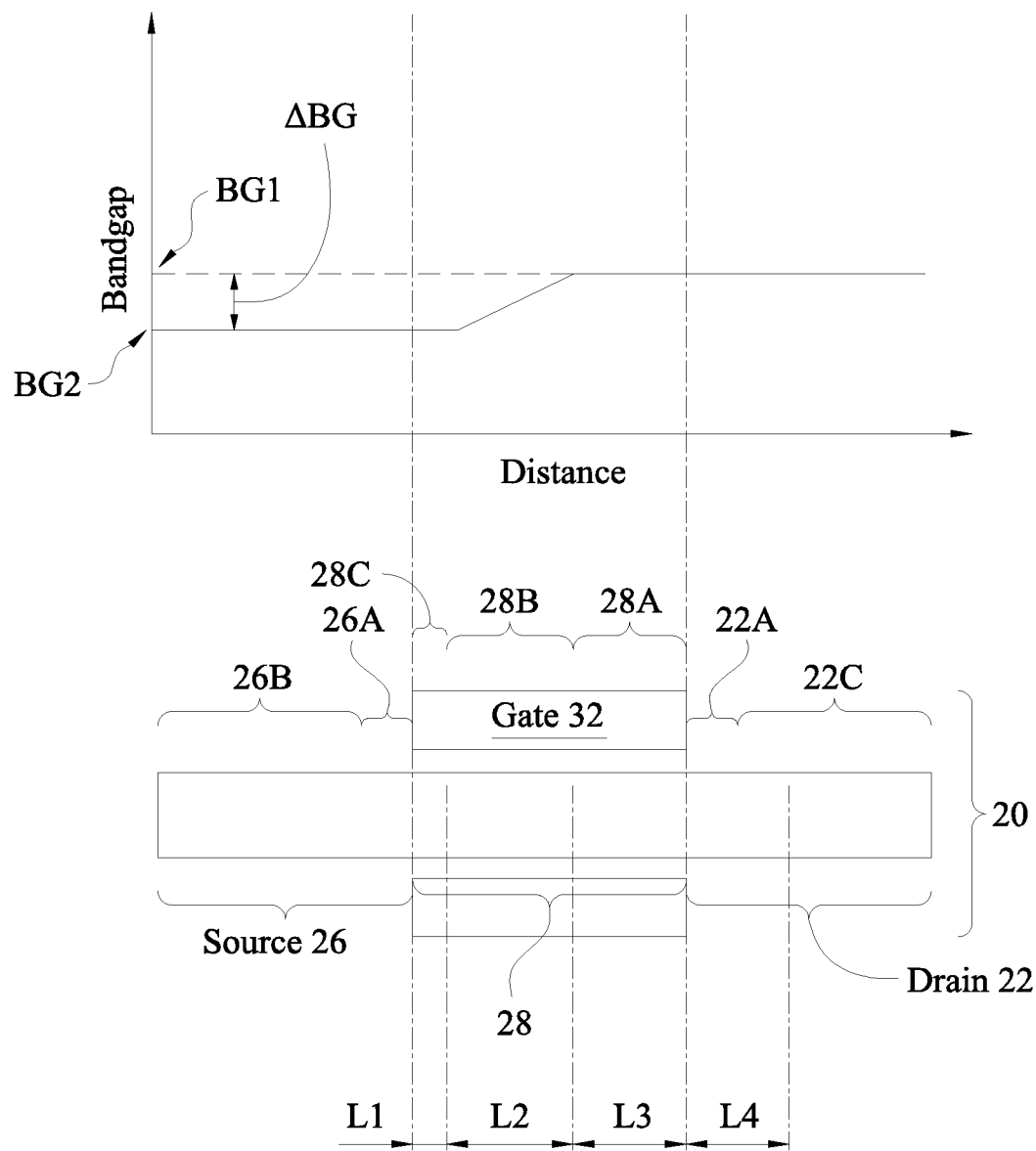
Figure 6:
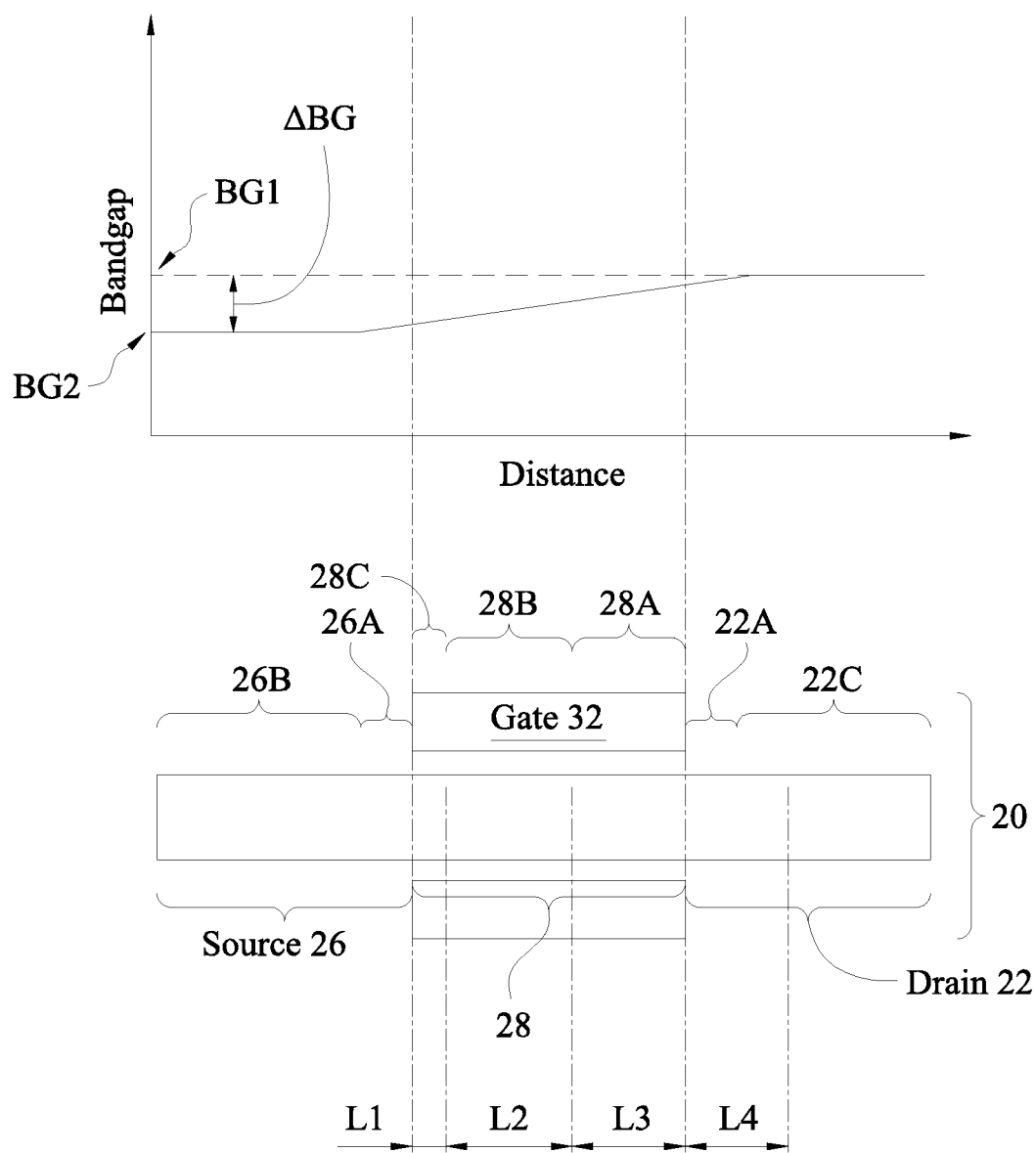

FIGS. 2 through 6 illustrate the bandgap change (which also reflects the composition change) of drain region 22, source region 26, and channel region 28 as functions of the distances measuring from the top end of source region 26 (FIG. 1) and toward drain region 22. Throughout FIGS. 2 through 6, gate electrode 32 is also illustrated, and the bandgap of each portion of drain region 22, source region 26, and channel region 28 may be found from the overlying diagram illustrating the bandgaps. It is noted that the bandgaps shown in FIGS. 2 and 6 are schematic, and are shown in a relative scale. For the convenience of illustration, drain region 22, source region 26, and channel region 28 are illustrated horizontally although they are actually vertical in FIG. 1.

Channel region 28 has the left end contacting the right end of source region 26, and the right end contacting the left end of drain region 22. The left end and the right end of channel 28 are also aligned to the left end and the right end, respectively, of gate 32. Channel region 28 includes drain-side channel portion 28A, source-side channel portion 28C, and middle channel portion 28B. Drain-side channel portion 28A is the portion extending from the right end (the drain end) of channel region 28 toward middle channel portion 28B. Source-side channel portion 28C is the portion extending from the left end (the source end) of channel region 28 toward middle channel portion 28B. Also, drain region 22 may include portion 26A and end portion 22C, with portion 22A closer to channel region 28 than end portion 22C. Source region 26 may include portion 26A (FIG. 5) and end portion 26B, with portion 26A closer to channel region 28 than end portion 26B. In accordance with some embodiment, length L1 of source-side channel portion 28C is smaller than about 45 nm. Length L3 of drain-side channel portion 28A is greater than about 10 nm, and may be in the range between about 10 nm and about 40 nm. Total length (L1+L2+L3) may be in the range between about 15 nm and about 50 nm (or higher if individual lengths L1, L2, or L3 have higher values). Each of lengths L1, L2, and L3 may be greater than about 5 nm.

As shown in FIGS. 2 through 6, different parts of drain region 22, source region 26, and channel region 28 may have different bandgaps. In accordance with some embodiments of the present disclosure, the differences in the bandgaps is achieved by adjusting the percentages of the elements in drain region 22, source region 26, and channel region 28 during the respective epitaxy. For example, when silicon and germanium are used to form drain region 22, source region 26, and/or channel region 28, the percentages of silicon and germanium may be adjusted. Silicon has the bandgap of about 1.12 eV. Germanium has a lower bandgap of about 0.66 eV. Silicon germanium ($Si_xGe_{1-x}$) has the bandgap between the bandgap of silicon and the bandgap of germanium. Furthermore, the bandgap of $Si_xGe_{1-x}$ is related to the value of x (the atomic percentage of silicon) and the atomic percentage (1-x) of germanium, and the higher the x is, the higher the bandgap $Si_xGe_{1-x}$ has. Hence, drain region 22, source region 26, and channel region 28 may be formed of silicon (without germanium), germanium (without silicon), or silicon germanium, with the atomic percentages of silicon and germanium adjusted to adjust the bandgaps.

In other exemplary embodiments wherein III-V compound semiconductors are used to form drain region 22, source region 26, and/or channel region 28, the percentages of the III-V elements may be adjusted to adjust the bandgaps. For example, InAs has a bandgap lower than the bandgap of GaAs, and $In_yGa_{1-y}As$ has a bandgap between the bandgaps of GaAs and InAs. The bandgap of $In_yGa_{1-y}As$ is related to the value of y (the atomic percentage of indium (In)) and the atomic percentage (1-y) of gallium, and the higher the y is, the lower the bandgap the respective $In_yGa_{1-y}As$ has.

Due to the dependence of the bandgaps on the atomic percentages, the bandgaps of different parts of drain region 22, source region 26, and/or channel region 28 may be adjusted gradually to have graded bandgaps, or may be changed abruptly to have abrupt bandgap changes. This may be achieved by either gradually or abruptly increasing and/or decreasing the flow rates of different precursors in the formation process. Accordingly, in FIGS. 2 through 6, the change in the bandgaps also indicates the change in the compositions (such as the elements and the percentages of the elements) of drain region 22, source region 26, and/or channel region 28.

Figure 3:
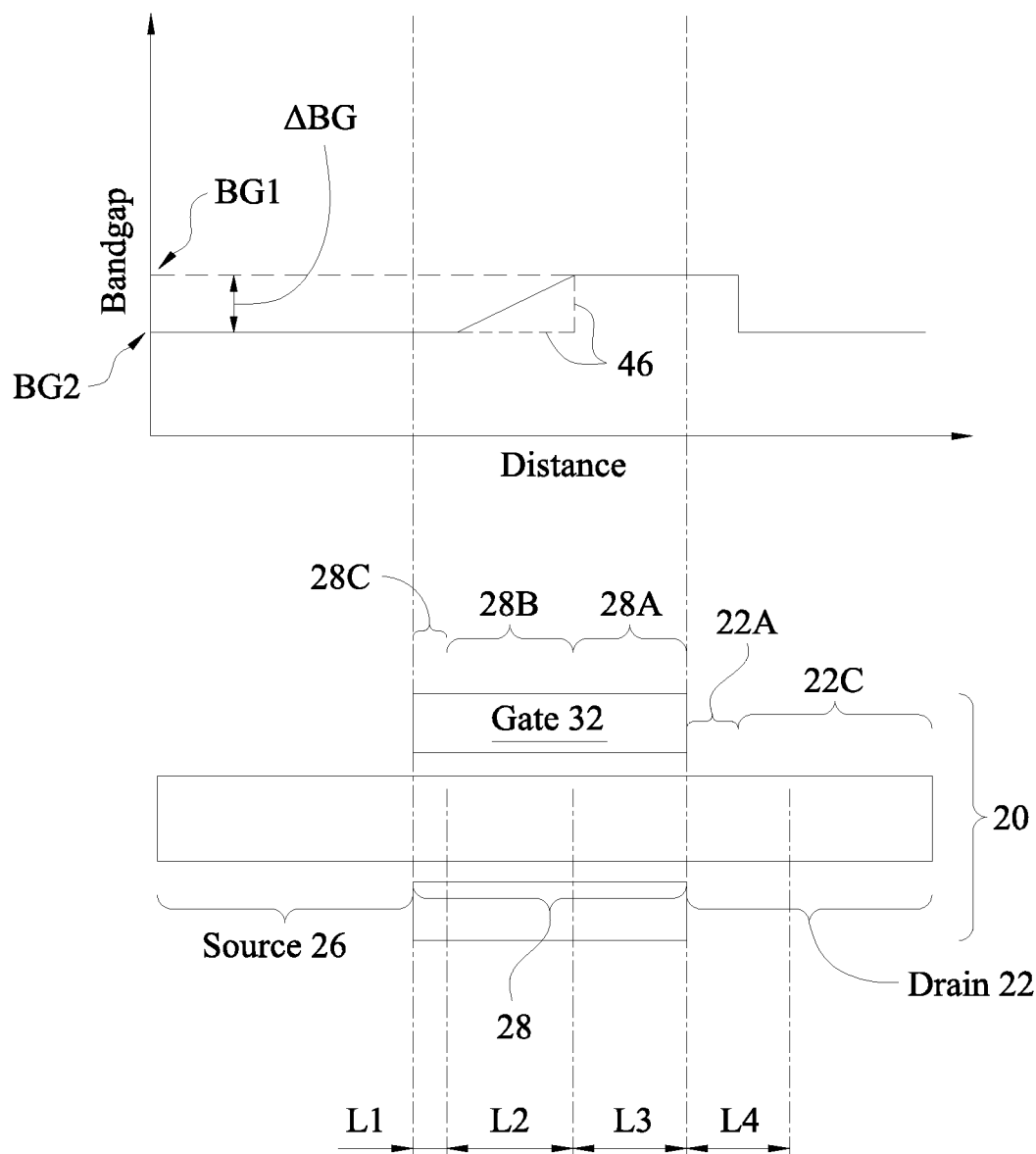

It is also noted that although each of FIGS. 2 through 6 illustrates an exemplary combination of drain region 22, source region 26, and/or channel region 28 that has its own bandgap scheme, the bandgap scheme of each of drain region 22, source region 26, and channel region 28 may also be replaced (when applicable) by the bandgaps of the respective regions in other figures. For example, although FIG. 5 illustrates that drain region 22 has a uniform high bandgap BG1, the bandgap scheme of drain region 22 in FIG. 5 may also be replaced by the bandgap schemes of drain regions 22 in FIG. 2 or FIG. 3. Similarly, the bandgap scheme in source region 26 and channel region 28 in FIGS. 2 and 3 may also be replaced by the gap schemes of source region 26 and channel region 28 in FIG. 5.

As shown in FIG. 2, drain-side channel portion 28A has bandgap BG1 higher than the bandgap BG2 of source-side channel portion 28C. The difference ΔBG, which is equal to (BG1−BG2), may be higher than about 0.2 eV, higher than about 0.5 eV, or higher than about 1.0 eV. In accordance with some embodiments, middle channel portion 28B has a graded bandgap as shown in FIG. 2, wherein the portions of middle channel portion 28B closer to source-side channel portion 28C have lower bandgaps, which may be equal to or higher than BG2. The portions of middle channel portion 28B increasingly closer to drain-side channel portion 28A have increasingly higher bandgaps. Throughout the description, middle channel portion 28B is also referred to as a graded channel portion. Middle channel portion 28B may act as a transitioning portion so that with the increase in the "distance" (the x axis), bandgaps may be gradually and smoothly transition from BG2 to BG1. In accordance with some embodiments, the length L2 of middle channel portion 28B is greater than about 20 percent, or greater than about 30 percent. In accordance with some embodiment, the length L2 is in the range between about 5 nm and about 50 nm. In alternative embodiments, length L2 is very small and is close to 0 nm, and hence channel region 28 has an abrupt change in bandgap. An abrupt change in the bandgaps in channel region 28 is schematically illustrated by dashed lines 46 in FIG. 2.

An advantageous feature of allowing the drain-side channel portion 28A to have a high bandgap is that the Gate-Induced Drain Leakage (GIDL) is affected by drain-side channel portion 28A, and the higher the bandgap the drain-side channel portion 28A has, the lower the GIDL is resulted. Accordingly, by increasing the bandgap of drain-side channel portion 28A, the GIDL may be reduced. On the other hand, by maintaining the source-side channel portion 28C and middle channel portion 28B to have low bandgaps, the saturation current of the respective VGAA transistor 20 is high.

As also show in FIG. 2, drain region 22 further includes region 22A and 22B. Region 22A is a portion that also affects the GIDL, and hence is referred to as GIDL-affecting drain portion 22A hereinafter. Again, the higher bandgap GIDL-affecting drain portion 22A has, the lower the GIDL is resulted. Accordingly, by increasing the bandgap of GIDL-affecting drain portion 22A, the GIDL may be reduced. As shown in FIG. 2, the bandgap of GIDL-affecting drain portion 22A is higher than bandgap BG2. Portions of GIDL-affecting drain portion 22A may have bandgap equal to bandgap BG1. Furthermore, GIDL-affecting drain portion 22A may include a graded portion in which the bandgap gradually increases or decreases. In some embodiments, drain portion 22C has a bandgap higher than, equal to, or smaller than BG2. By maintaining drain portion 22C to have a low bandgap, the drain resistance is low, and hence the resulting VGAA transistor 20 has a high saturation current.

Drain region 22 may also include graded drain region 22B, in which the bandgap gradually transitions from the high bandgap of GIDL-affecting drain portion 22A to the low bandgap of drain portion 22C.

In accordance with some embodiment, length L4 of drain portions 22A and 22B in combination is smaller than about 20 nm, and may be in the range between about 5 nm and about 20 nm. The length of the entire drain region 22 may be in the range between about 10 nm and about 100 nm in some exemplary embodiments.

Source region 26 has a low bandgap lower than the bandgaps of drain-side channel portion 28A and GIDL-affecting drain portion 22A. In some embodiments, the bandgap of source region 26 is equal to BG2, and may be equal to or lower than the bandgap of source-side channel portion 28C. By maintaining source region 26 to have a low bandgap, the source resistance is low, and hence the resulting VGAA transistor 20 has a high saturation current.

FIGS. 3 through 6 illustrate cross-sectional views and bandgaps of VGAA transistors 20 in accordance with alternative embodiments. Unless specified otherwise, the materials and the bandgaps of the components in these embodiments are essentially the same as the like components, which are denoted by like reference notations in the embodiments shown in FIGS. 1 and 2.

FIG. 3 illustrates the bandgaps of the embodiments similar to the embodiments shown in FIG. 2, except that drain region 22 does not include a graded region in which bandgap changes gradually. Instead, GIDL-affecting drain portion 22A contacts drain portion 22C, and there is an abrupt drop in bandgaps from GIDL-affecting drain portion 22A to drain region 22C. The abrupt drop may occur in a region less than 1 nm thick in some embodiments.

FIG. 4 illustrates the bandgaps of the embodiments similar to the embodiments in FIGS. 2 and 3, except that the entire drain region 22 has a high bandgap that is higher than the bandgaps of source region 26 and source-side channel portion 28C. Furthermore, drain region 22 may have a uniform bandgap, which may be equal to or lower than the bandgap of drain-side channel portion 28A.

FIG. 5 illustrates the bandgaps of the embodiments similar to the embodiments in FIG. 4, except that the grading of the bandgap starts from source region 26 rather than from the left edge of middle portion 28B. Alternatively stated, source region 26 includes portion 26B having low bandgap BG2, and graded source portion 26A having a graded bandgap higher than bandgap BG2. Source portion 26A, source-side channel portion 28C, and middle channel portion 28B may form a continuous graded region in which the bandgaps gradually and smoothly increase. In these embodiments, drain region 22 may have a uniform high bandgap BG1. In alternative embodiments, the bandgap in drain region 22 may be similar to what are shown in FIGS. 2 and 3. In accordance with some embodiment, length L1 of source portion 26A is smaller than about 5 nm.

FIG. 6 illustrates the bandgaps of VGAA transistor 20 in accordance with yet alternative embodiments. In these embodiments, source region 26 includes portion 26B having low bandgap BG2, and graded portion 26A in which the bandgap gradually increases. Drain region 22 also includes portion 22C having high bandgap BG1, and graded portion 22A in which the bandgap gradually increases. The entire channel region 28 is graded and has a gradually increased bandgap. Furthermore, regions 22A, 28, and 26A may form a continuous region in which the bandgap gradually and smoothly transition from BG1 to BG2.

Figure 7:
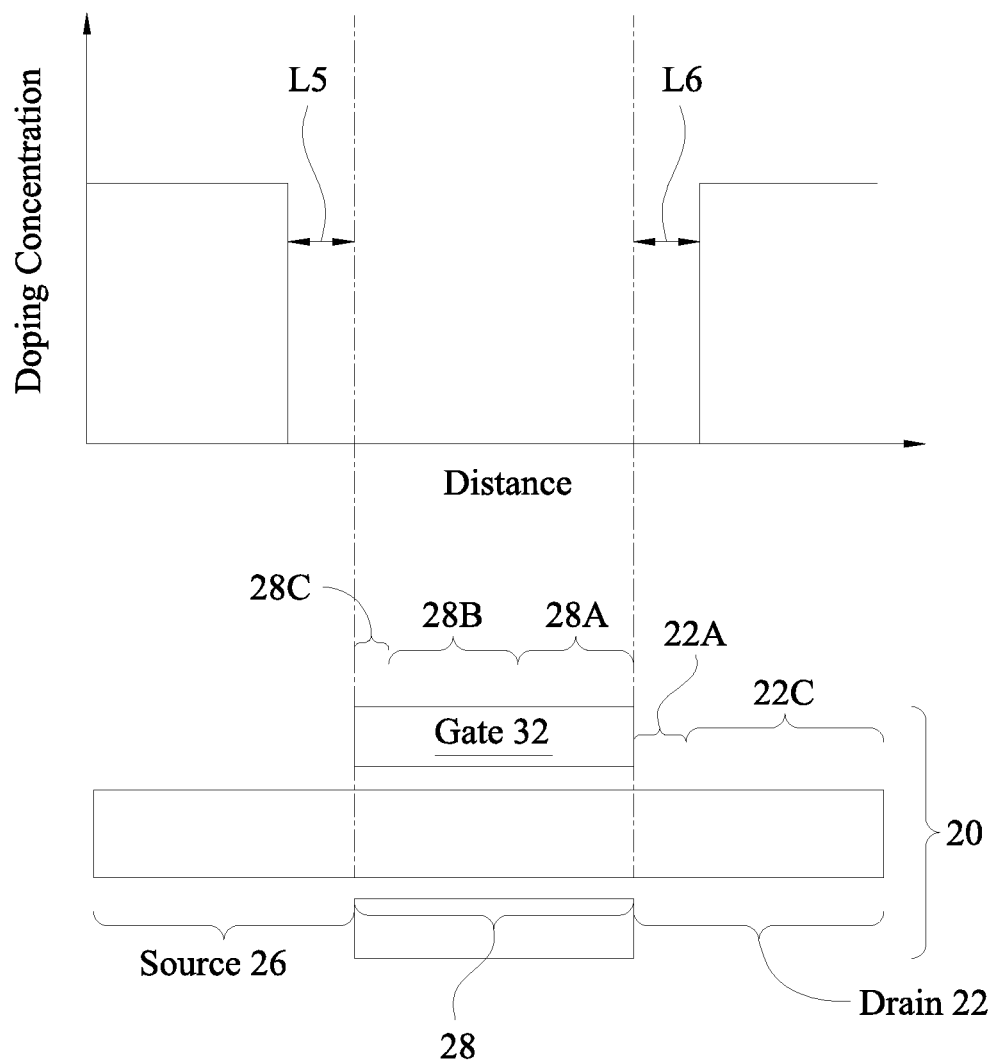
FIG. 7 illustrates the p-type or n-type doping in the channel region, source region, and drain region of VGAA transistors in accordance with some embodiments.

FIG. 7 schematically illustrates the doping concentrations of drain region 22, source region 26, and channel region 28 in accordance with some embodiments of the present disclosure. In the embodiments in which drain region 22 and source region 26 are formed of Si, Ge, or SiGe, the dopants in drain region 22 and source region 26 may include boron and/or indium when VGAA transistor 20 is p-type, or phosphorous, arsenic, and/or antimony when VGAA transistor 20 is n-type. In the embodiments in which drain region 22 and source region 26 are formed of III-V compound semiconductors, the dopant in drain region 22 and source region 26 may include Be, Ge, Mg, Zn, Cd, C, Sn, and/or Si when VGAA transistor 20 is p-type, or Si, C, Se, Sn, S, Se, and/or Te when VGAA transistor 20 is n-type. In accordance with some embodiments, the p-type or n-type doping concentration in drain region 22 and source region 26 may be in the range between about $1E15/cm^3$ and about $5E20/cm^3$.

Channel region 28 may be intrinsic, with no p-type or n-type dopants doped intentionally. In alternative embodiments, channel region 28 is doped as n-type when VGAA transistor 20 is of p-type, or doped as p-type when VGAA transistor 20 is of n-type. In accordance with some embodiments, the p-type or n-type doping concentration in channel region 28 is in the range between about $1E15/cm^3$ and about $5E19/cm^3$.

FIG. 7 also illustrates that source region 26 may have offset distance L5 from the edge of channel region 28, wherein offset distance L5 may be in the range between about −5 nm and about 15 nm. Drain region 22 may have offset distance L6 from the edge of channel region 28, wherein offset distance L6 may be in the range between about −5 nm and about 40 nm. The negative values indicate that the respective highly doped regions extend into channel region 28.

Figure 8:
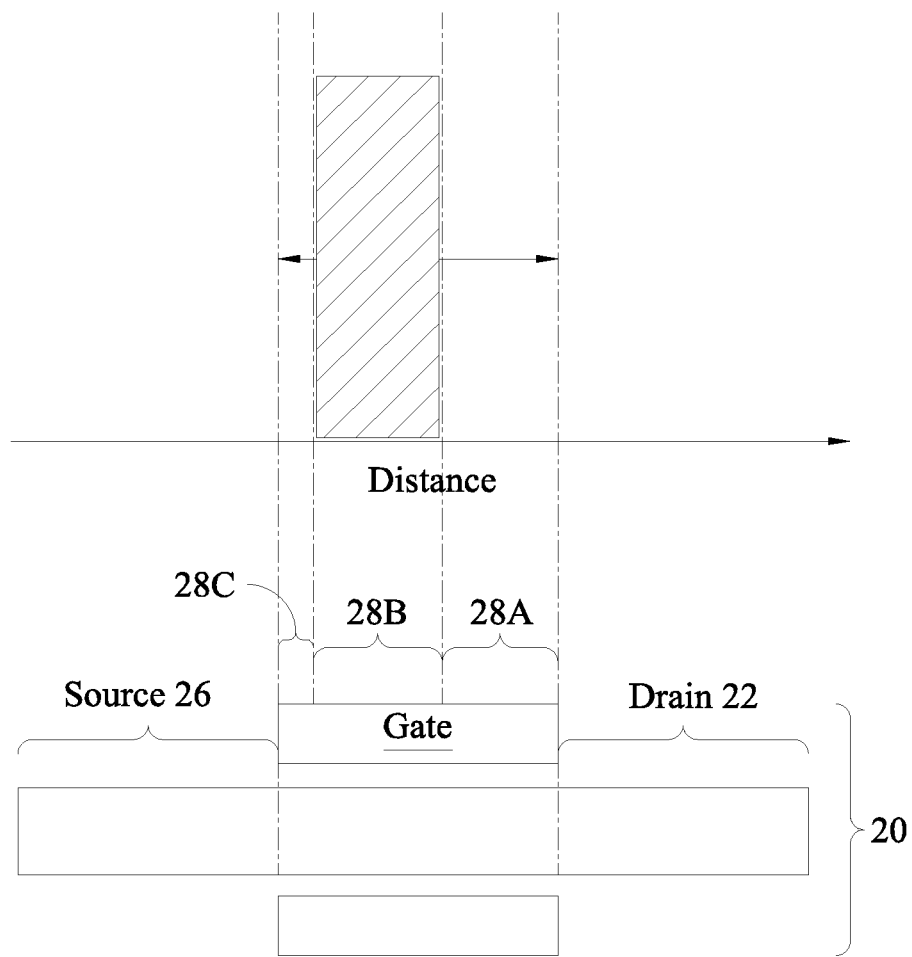
FIG. 8 illustrates a relative position of a graded channel portion in a VGAA transistor in accordance with some embodiments.

FIG. 8 schematically illustrates the relative position of graded portion 28B in channel 28. An advantage feature of the embodiments of the present disclosure is that the threshold voltage of VGAA transistor 20 may be adjusted by adjusting the relative position of the graded portion 28B. When the graded portion 28B is shifted to the left or to the right, as represented by arrows, the threshold voltage may be adjusted.

Figure 9:
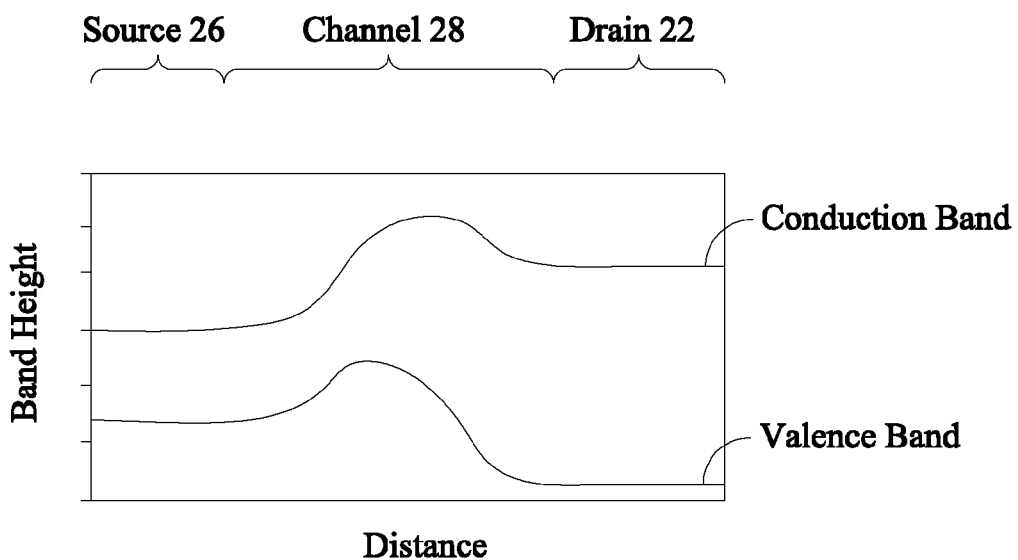
FIG. 9 illustrates the band diagrams of the channel region, source region, and drain region of a VGAA transistor at a no-bias state in accordance with some embodiments.
Figure 10:
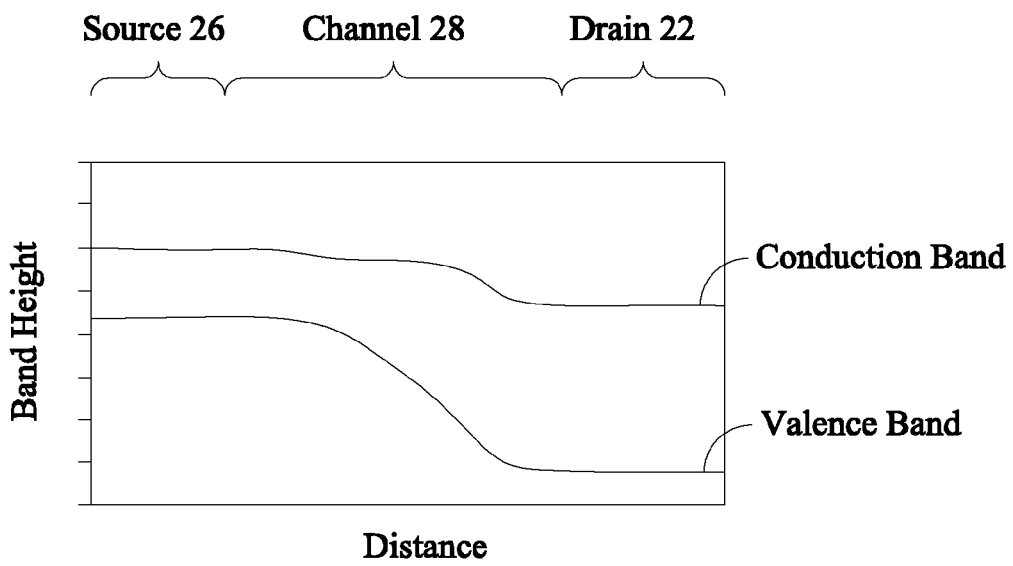
FIG. 10 illustrates the band diagrams of the channel region, source region, and drain region of a VGAA transistor at an on-state in accordance with some embodiments.
Figure 11:
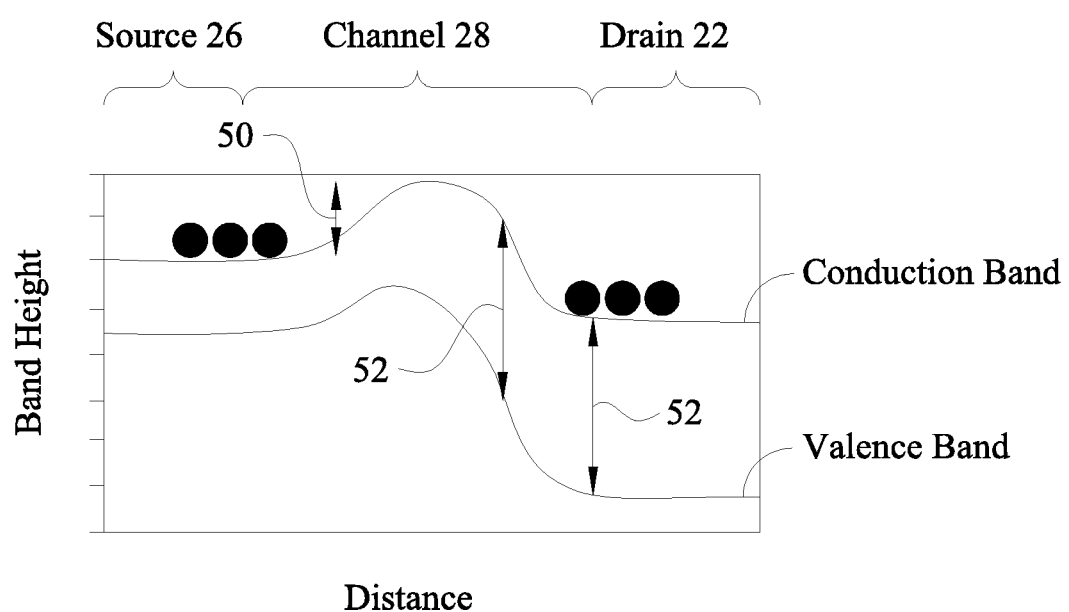
FIG. 11 illustrates the band diagrams of the channel region, source region, and drain region of a VGAA transistor at an off-state in accordance with some embodiments.

FIGS. 9, 10, and 11 illustrate the bandgaps of the valence bands and conduction bands when VGAA transistor 20 is at a no-bias state, an on-state, and an off-state, respectively. As shown in FIG. 11, at the off-state, the source-side carriers (electrons, for example, the dots on the left side) observe a barrier 50, which is the barrier that the carriers need to overcome for the leakage to occur. As a comparison, in conventional transistors, the source region, drain region, and the channel region of a transistor may be formed of the same material, the barrier will be reduced to zero since the entire conduction band (or valence band) will be flat. Accordingly, in the embodiments of the present invention, at the off-state, the leakage is reduced due to the increased barrier 50. In addition, the GIDL has to overcome larger tunnel barrier 52 before the GIDL can occur. Since this barrier is higher due the enlarged bandgaps of regions 28A and 22A, the GIDL leakage is further reduced.

The embodiments of the present disclosure have some advantageous features. By allowing the drain-side channel portion and GIDL-affecting drain portion to have high bandgaps, the GIDL is reduced. Since the GIDL current in small bandgap channel materials is dominated by Band-To-Band-Tunneling (BTBT) current on the drain side of the channel and the GIDL-affecting drain portion, and the BTBT current is inversely proportion to the bandgap of the channel material, the GIDL current may be inversely proportional to the bandgap when GIDL is the dominate off-state leakage. Accordingly, increasing the bandgaps of the drain-side channel portion and the GIDL-affecting drain portion results in the reduction in the leakage current.

Furthermore, by maintaining the bandgaps of source regions, some portions of drain regions, and the source-side channel portions to be low, the saturation current of the VGAA transistor may be increased.

In accordance with some embodiments of the present disclosure, a device includes a source region, a drain region, and a semiconductor channel connecting the source region to the drain region. The semiconductor channel includes a source-side channel portion adjoining the source region, wherein the source-side channel portion has a first bandgap, and a drain-side channel portion adjoining the drain region. The drain-side channel portion has a second bandgap different from the first bandgap.

In accordance with alternative embodiments of the present disclosure, a device includes a source region, a drain region, and a semiconductor channel connecting the source region to the drain region. The semiconductor channel has a graded channel portion having a graded bandgap.

In accordance with yet alternative embodiments of the present disclosure, a device includes a substrate having a major top surface, and a nanowire having a lengthwise direction perpendicular to the major top surface. The nanowire includes a source region, a drain region, and a semiconductor channel between the source region and the drain region. The semiconductor channel includes a source-side channel portion adjoining the source region, wherein the source-side channel portion has a first bandgap, and a drain-side channel portion adjoining the drain region. The drain-side channel portion has a second bandgap higher than the first bandgap. The device further includes a gate dielectric encircling the channel region, and a gate surrounding the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A VGAA transistor comprising:
a source region;
a drain region; and
a semiconductor channel connecting the source region to the drain region, wherein the semiconductor channel comprises a plurality of channel portions, of which one of the plurality of channel portions is a graded channel portion having a graded bandgap, the graded bandgap gradually transitioning from a first bandgap to a second bandgap different from the first bandgap, and another of the plurality of channel portions has a substantially uniform bandgap.

2. The VGAA transistor of claim 1, wherein in the graded channel portion, bandgaps of portions closer to the drain region are increasingly higher than portions closer to the source region.

3. The VGAA transistor of claim 1, wherein the graded channel portion has a first end contacting the source region, and a second end at an intermediate position of the semiconductor channel, and the second end contacts a drain-side channel portion having a substantially uniform bandgap.

4. The VGAA transistor of claim 1, wherein the source region has a bandgap lower than a bandgap of the drain region.

5. The VGAA transistor of claim 1 further comprising:
a source-side channel portion with a first uniform bandgap between the graded channel portion and the source region, wherein the first uniform bandgap is substantially equal to the first bandgap; and
a drain-side channel portion with a second uniform bandgap between the graded channel portion and the drain region, wherein the second uniform bandgap is substantially equal to the second bandgap, and wherein the second uniform bandgap is higher than the first uniform bandgap.

6. The VGAA transistor of claim 5, wherein the drain region has a first portion joining the drain-side channel portion, and the first portion of the drain region has a third bandgap higher than the first uniform bandgap.

7. The VGAA transistor of claim 6, wherein the drain region further comprises a second portion, with the first portion between the second portion and the drain-side channel portion, and wherein the second portion of the drain region has a fourth bandgap lower than the third bandgap.

8. A VGAA transistor comprising:
a source region;
a drain region; and
a semiconductor channel connecting the source region to the drain region, wherein the semiconductor channel comprises:
a source-side channel portion adjoining the source region, wherein the source-side channel portion has a first bandgap;
a drain-side channel portion adjoining the drain region, wherein the drain-side channel portion has a second bandgap; and
a middle portion between the source-side channel portion and the drain-side channel portion, wherein the middle portion has a graded bandgap, the graded bandgap gradually transitioning from the first bandgap to the second bandgap different from the first bandgap, wherein one of the first bandgap or the second bandgap has a substantially uniform bandgap.

9. The VGAA transistor of claim 8, wherein the second bandgap is greater than the first bandgap.

10. The VGAA transistor of claim 8, wherein the graded channel portion has a first end contacting the source region, and a second end contacting the drain region.

11. The VGAA transistor of claim 8, wherein the drain region has a first portion joining the drain-side channel portion, and the first portion of the drain region has a third bandgap higher than the first bandgap.

12. The VGAA transistor of claim 11, wherein the drain region further comprises a second portion, with the first portion located between the second portion and the drain-side channel portion, and wherein the second portion of the drain region has a fourth bandgap lower than the third bandgap.

13. The VGAA transistor of claim 11, wherein the third bandgap is graded.

14. The VGAA transistor of claim 8, wherein the source region comprises a first portion joining the source-side channel portion, and a second portion separated from the source-side channel portion by the first portion of the source region, and wherein the first portion of the source region has a graded bandgap.

15. The VGAA transistor of claim 14, wherein the second portion of the source region has a bandgap lower than the graded bandgap of the first portion of the source region.

16. A VGAA transistor comprising:
a source region;
a drain region; and
a semiconductor channel between the source region and the drain region, wherein the semiconductor channel comprises:
a source-side channel portion adjoining the source region, wherein the source-side channel portion has a first bandgap;

a drain-side channel portion adjoining the drain region, wherein the drain-side channel portion has a second bandgap higher than the first bandgap; and a graded channel portion between the source-side channel portion and the drain-side channel portion, the graded channel portion having a graded bandgap, the graded bandgap gradually transitioning from the first bandgap to the second bandgap different from the first bandgap, wherein one of the first or second bandgaps has a substantially uniform bandgap.

17. The VGAA transistor of claim 16 further comprising a source contact and a drain contact encircling the source region and the drain region, respectively.

18. The VGAA transistor of claim 16, wherein in the graded channel portion, portions closer to the drain-side channel portion have bandgaps higher than bandgaps of portions closer to the source-side channel portion.

\* \* \* \* \*